United States Patent [19]

Kennon et al.

[11] 4,402,059

[45] Aug. 30, 1983

[54] LOAD MANAGEMENT TERMINAL

[75] Inventors: Jerry M. Kennon; John S. Phillips, both of Raleigh, N.C.

[73] Assignee: Westinghouse Electric Corp., Pittsburgh, Pa.

[21] Appl. No.: 252,685

[22] Filed: Apr. 9, 1981

[51] Int. Cl.[3] ............................................. G01R 21/00
[52] U.S. Cl. ....................................... 364/900; 364/200
[58] Field of Search ... 364/200 MS File, 900 MS File, 364/492–494

[56] References Cited

U.S. PATENT DOCUMENTS

| | | | |
|---|---|---|---|
| 3,525,078 | 8/1970 | Baggott | 364/900 |
| 3,906,242 | 9/1975 | Stevenson | 364/493 |
| 4,167,786 | 9/1979 | Miller et al. | 364/493 |
| 4,264,960 | 4/1981 | Gurr | 364/492 |

*Primary Examiner*—Gareth D. Shaw
*Assistant Examiner*—T. Flyntz
*Attorney, Agent, or Firm*—Robert E. Converse, Jr.

[57] ABSTRACT

A load management terminal is utilized as an end device in a utility's distribution network communication system. The distribution network carries electrical power as well as communication signals. The load management terminal is comprised of a power line coupling unit for connecting the load management terminal to the power distribution network. A signal receiver and conditioning unit produces a command signal in response to a received communication signal. A solid state memory contains preprogrammed instructions and data. A control logic circuit performs load control functions in response to the preprogrammed instructions, data and the command signal. These load control functions include the opening and closing of load control switches for selectively disconnecting and connecting, respectively, customer loads. A cold load pick-up produces power outage information enabling the load management terminal to provide local, load control functions.

5 Claims, 6 Drawing Figures

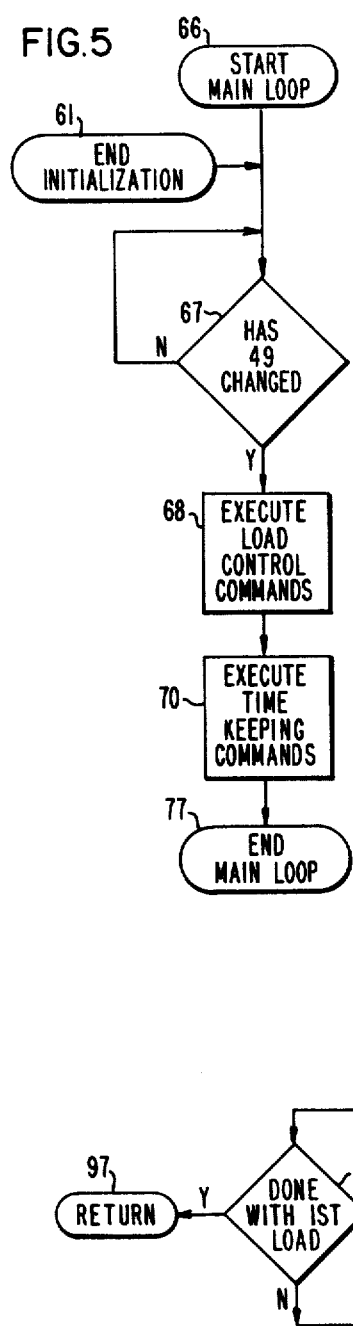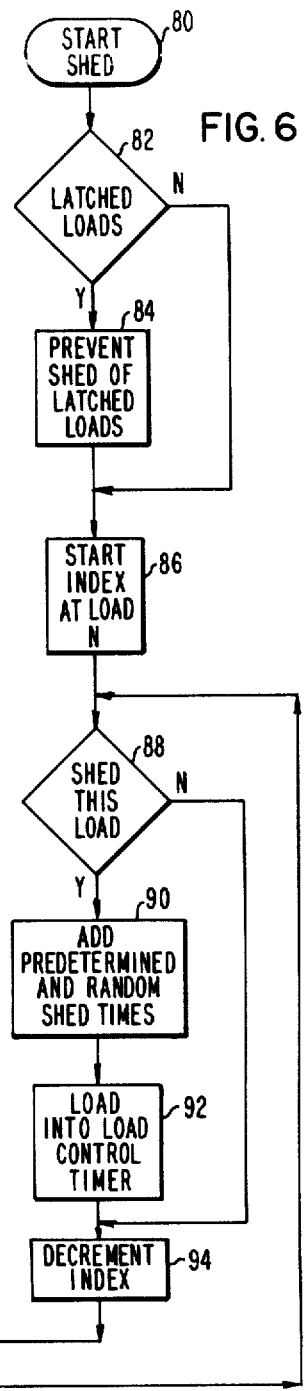

LOAD MANAGEMENT TERMINAL

BACKGROUND OF THE INVENTION

1. Field of the Invention

This invention generally relates to remote communication terminals capable of collecting data and performing load management functions.

2. Description of the Prior Art

Several types of distribution network communication systems exist for communicating over the power-line conductors of a utility's power distribution network. The purpose of the communication system is to allow a central control station to communicate with individual or groups of utility customers. Such communications may include instructions for data acquisition or load control. In order to receive and implement these instructions the utility customer location must be equipped with some type of equipment responsive to the received instructions, such as a load management terminal.

A typical load management terminal is capable of receiving communication signals, determining which of the received signals were addressed to it, and taking appropriate action in response. Appropriate action may be to interrogate a time of day meter, shed specific loads or update a local clock. The load management terminal is also capable of transmitting meter data and other information from the customer location, through the distribution network, back to the electric utility.

In order to perform all of these functions and still be capable of mass production at cost effective prices, load management terminals are typically designed around a microprocessor. The microprocessor can perform a variety of functions such as comparing the address of a received signal to stored addresses, performing an error check on the received signal, etc., while discrete circuits and output devices, under microprocessor control, perform other necessary functions such as receiving or transmitting a communication signal, disconnecting loads, etc. For the microprocessor based load management terminal to operate properly, up-to-date information encoded in the received signal or received from devices at the customer location must be input to the microprocessor, and the microprocessor must be appropriately programmed so as to respond to this information. The present invention is for a load management terminal capable of internally producing power outage information enabling the load management terminal to provide additional control functions.

SUMMARY OF THE PRESENT INVENTION

The present invention is a microprocessor based load management terminal performing additional control functions in response to power outages. The load management terminal is utilized as an end device in a utility's distribution network communication system. The distribution network carries electrical power as well as communication signals. The load management terminal is comprised of a power-line coupling unit for connecting the load management terminal to the power distribution network. A signal receiver and conditioning unit produces a command signal in response to the power-line coupling unit. A solid state memory contains preprogrammed data and instructions. A microprocessor performs load management functions in response to the command signal.

The load management terminal also includes a power supply producing regulated voltages for the load management terminal, a load control switch for selectably connecting a load to the distribution network and a cold load pickup for monitoring the duration of power outages. If the duration of a power outage exceeds a predetermined time period, the cold load pickup controls the switch so as to disconnect the load from the distribution network for a predetermined time period. This local load shed results in a load reduction so as to reduce the demand for power upon the return of electrical power.

BRIEF DESCRIPTION OF THE DRAWINGS

FIG. 5 is a flow chart illustrating the normal operating routine of the present invention; and FIG. 6 is a flow chart illustrating the load shed routine of the present invention.

DESCRIPTION OF THE PREFERRED EMBODIMENT

Figure 1:
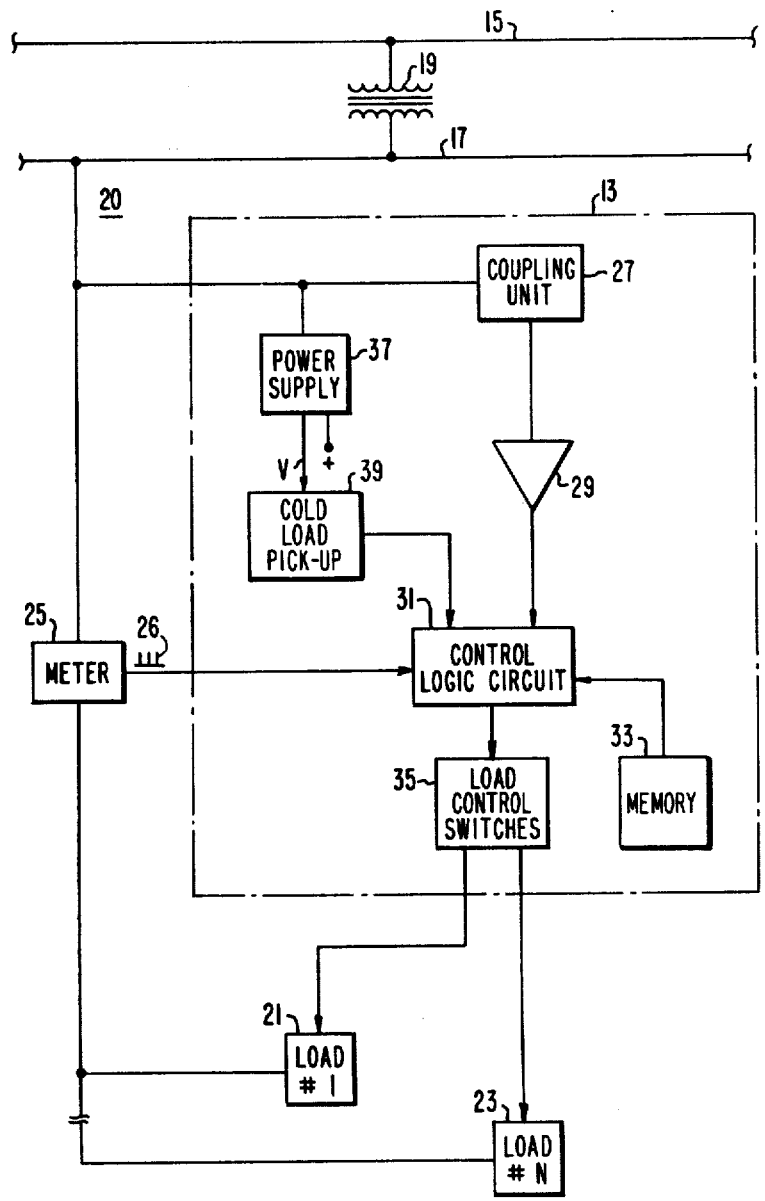
FIG. 1 is a block diagram illustrating a load management terminal constructed according to the teachings of the present invention.

FIG. 1 is a block diagram illustrating a load management terminal (hereinafter LMT) 13 constructed according to the teachings of the present invention. FIG. 1 also illustrates, in block diagram form, the typical environment in which the LMT 13 is found. A primary feeder 15 of a utility's power distribution network is connected to a conductor 17 through a distribution transformer 19. The conductor 17 is used to deliver electrical power to a plurality of customer sites, a typical customer site 20 being illustrated in FIG. 1. Electrical power is delivered to a plurality of loads 21 and 23 within the customer site 20. The electrical power is delivered through an electric energy meter 25 of the type having an encoding register capable of producing a pulse signal 26 representative of the electric energy consumption. The loads 21 and 23 together with the electric energy meter 25 and the LMT 13 make up the customer site 20.

The LMT 13 is comprised of a power-line coupling unit 27 which connects the LMT to the power distribution system. A signal receiver and conditioner 29 is responsive to the coupling unit 27 to provide command signals in response to received communication signals. The command signals are input to a control logic circuit 31. The control logic circuit 31 is comprised of several components including a microprocessor. A memory 33 contains programmed information and instructions necessary for the proper operation of the microprocessor. The control logic cicuit 31 controls a plurality of load control switches 35. The control logic circuit 31 also receives the pulse signal 26. The control logic circuit 31 provides a plurality of functions such as interrogating the electric energy meter 25 and opening and closing load control switches 35 thereby removing and adding loads to the power distribution network.

The LMT 13 additionally includes a power supply 37 producing regulated supply voltages for the LMT 13. One of the supply voltages is monitored by a cold load pickup 39 which is used for monitoring the duration of power outages. An output signal produced by the cold load pickup 39 is input to the control logic circuit 31. The cold load pickup 39 is discussed in further detail in conjunction with FIGS. 2 and 3 hereinafter.

Figure 2:
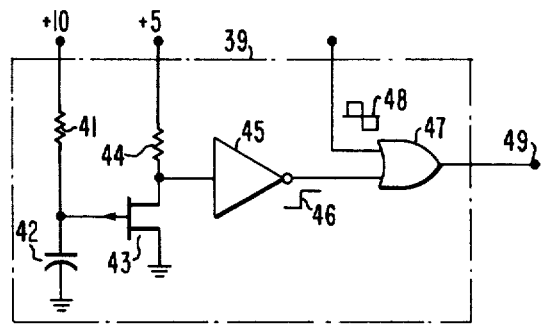
FIG. 2 is an electrical schematic illustrating the details of the cold load pickup shown in FIG. 1.

A desirable load control function is performed by the cold load pickup 39 shown in detail in FIG. 2. The basic function of the cold load pickup 39 is to inform the control logic circuit 31 when a power outage exceeds a predetermined time. This information is valuable for two reasons. First, the control logic circuit 31 can implement a local load shed such that the overall power necessary to stabilize the power distribution system after the power outage will be decreased. Secondly, when the LMT 13 is used in conjunction with a time of day meter, it is necessary for the control logic circuit 31 to realize that the local clock no longer contains valid real-time information so that the time of day meter can be switched to a base rate. These functions are provided by the cold load pickup 39 without the need for battery carry-over.

In FIG. 2 a ten volt source voltage is connected to ground through the series combination of a resistor 41 and a capacitor 42. The junction of the resistor 41 and the capacitor 42 is connected to a gate terminal of a field effect transistor 43. A drain terminal of the field effect transistor 43 is connected to ground. A source terminal of the field effect transistor 43 is connected to a five volt source voltage through a resistor 44 and to an input terminal of a Schmitt trigger 45. A cold load pickup signal 46 is available at an output terminal of the Schmitt trigger 45. The output terminal of the Schmitt trigger 45 is connected to an input terminal of an OR gate 47. The OR gate 47 receives a sixty Hz clock signal 48 at a second input terminal thereof. The sixty Hz clock signal 48 is selectively conducted through the OR gate 47 to an output terminal 49 of the cold load pickup 39 in response to the cold load pickup signal 46.

Figure 3:
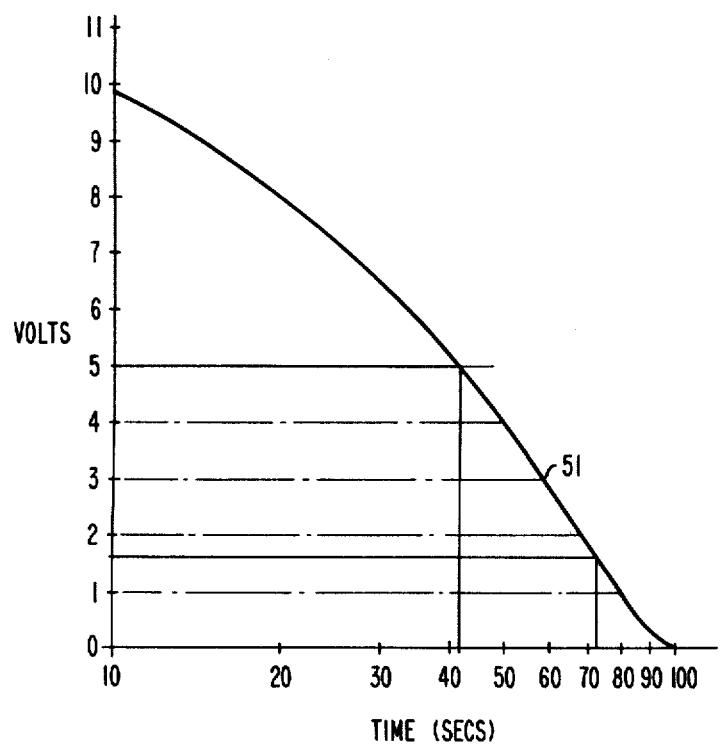
FIG. 3 is a graph of the voltage across the capacitor of the cold load pickup as a function of time.

The operation of the cold load pickup 39 may be more easily understood by referring to FIG. 3. A curve 51 shown in FIG. 3 represents a graph of the voltage across the capacitor 42 as a function of time. In order to produce the curve 51 a four microfarad capacitor was used for the capacitor 42 and a fifteen megohm resistor was used for the resistor 41. The Schmitt trigger 45 has a low trip point of 1.4 volts and a high trip point of 3.6 volts. When AC power is available the capacitor 42 is charged to ten volts and the field effect transistor 43 is non-conductive. With the field effect transistor 43 non-conductive the Schmitt trigger 45 sees five volts which is above its low trip point. The cold load pickup signal 46 is normally in a low state thus allowing the sixty Hz clock signal 48 to propagate through the OR gate 47.

When AC power is not available the voltage across the capacitor 42 begins to decay exponentially as shown in FIG. 3. Once the voltage across the capacitor 42 decays to five volts, which takes approximately forty seconds, the field effect transistor 43 begins to conduct. With the field effect transistor 43 conductive, the voltage at the input terminal of the Schmitt trigger 45 decays exponentially in a manner exactly equal to the voltage decay across the capacitor 42. Once the voltage across the capacitor 42, and therefore the voltage at the input terminal of the Schmitt trigger 45, reaches the low trip point of 1.4 volts, the cold load pickup signal 46 changes to a high state. As shown in FIG. 3 a power outage must last approximately seventy-five seconds before the cold load pickup signal 46 changes state. Once the cold load pickup signal 46 changes state, the signal available at the output terminal 49 will be in a high state regardless of the state of the sixty Hz clock signal 48. The control logic circuit 31 can, by periodically sampling the signal available at the output terminal 49, determine if a power outage greater than seventy-five seconds has occurred. When AC power is available the capacitor 42 will begin to charge up. However, because the upper trip point of the Schmitt trigger 45 is 3.6 volts a finite period of time is required before the cold load pickup signal 46 will return to its normal steady state condition. This delay provides the control logic circuit 31 with sufficient time to sample the voltage at the output terminal 49 even if the power outage only lasts seventy-six seconds. The time period timed out by the cold load pickup 39 may be varied by changing the value of the capacitor 42 or the resistor 41.

Figure 4:
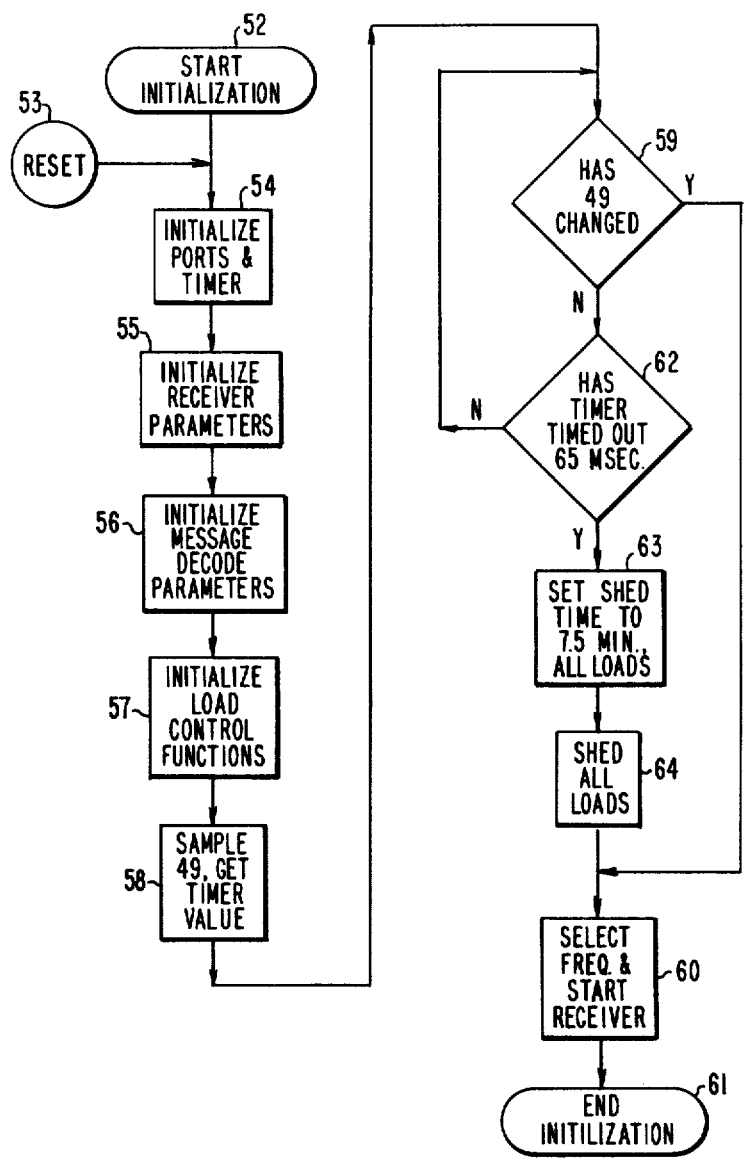
FIG. 4 is a flow chart illustrating the initialization routine of the present invention.

A certain amount of software is necessary in order for the LMT disclosed herein to benefit from the cold load pickup 39. Specifically, the control logic circuit 31 must be programmed so as to take appropriate action in response to the sampling of the signal available at the output terminal 49. In FIGS. 4, 5 and 6 software flow charts illustrate how, and where, these specific needs may be implemented within the normal software necessary for the proper operation of the LMT 13.

Turning first to FIG. 4, an initialization routine is begun at block 52. The initialization routine may alternatively be entered as the result of the control logic circuit 31 receiving a reset signal as indicated by balloon 53. The first step of the initialization routine is represented by block 54 wherein the microprocessor ports and the internal microprocessor timer (within the control logic circuit 31) are initialized. At block 55 the parameters of the signal receiver and conditioner 29 are initialized. At blocks 56 and 57 the message decode parameters and the load control functions, respectively, are initialized.

At block 58 the signal available at the output terminal 49 is sampled and the timer value is retrieved. Decision step 59 determines if the signal available at the output terminal 49 has changed. As discussed above, the signal available at the output terminal 49 is constantly changing in response to the sixty Hz clock signal 48 when AC power is available. Under normal operating conditions the control logic circuit 31 will proceed to block 60 where a frequency is selected and the signal receiver and conditioner 29 is started. At block 61 the initialization routine ends.

Returning to decision step 59, if the signal available at the output terminal 49 has not changed two possibilities exist. First, the control logic circuit 31 may have returned to sample the signal available at the output terminal 49 before the sixty Hz clock signal 48 has had sufficient time to change state. In this case, the control logic circuit 31 will want to wait to see if the signal available at the output terminal 49 changes state. Alternatively, the signal available at the output terminal 49 may not have changed states because of a power outage. In this case, the control logic circuit 31 will want to perform a load shed. Both of these possibilities are allowed for by block 62 wherein a timer internal to the control logic circuit 31 is allowed to time out sixty-five milliseconds before a load shed routine is performed. If the timer has not timed out, the control logic circuit 31 returns to decision step 59 to sample the signal at the output terminal 49. If the timer has timed out, and the signal available at the output terminal 49 has still not changed state, the control logic circuit 31 proceeds to step 63 wherein shed timers are set to a predetermined time, seven and one-half minutes in FIG. 4. After the shed timers are set all loads are shed at step 64 and the control logic circuit 31 proceeds to step 60.

FIG. 5 is a flow chart illustrating the main program loop of the present invention. The main program loop is begun at block 66. The main program loop may alternatively be entered from the end of the initialization loop as shown by block 61. The first step in the main program loop is decision step 67 wherein the logic control circuit 31 pauses until the signal available at the output terminal 49 has changed. In this case, the signal available at the output terminal 49 is being used as a clock signal since it regularly changes states at a frequency of sixty Hz when AC power is available. When the signal available at the output terminal 49 has changed state the logic control circuit 31 executes a series of load control commands as shown by block 68. After the load control commands have been executed, the logic control circuit 31 executes a series of time keeping commands as shown by block 70. The execution of the load control commands and the time keeping commands as represented by blocks 68 and 70, respectively, represent the bulk of the LMT's functions. The commands included in these blocks are for decrementing individual load timers, producing commands for reconnecting a load to the power distribution network in response to individual load timers, maintaining alternate time bases, and the like. After executing the time keeping commands the main program ends as shown by block 77. At this point, the main program may be executed again in which case the logic control circuit 31 will return to step 66.

The last flow chart is illustrated in FIG. 6 wherein the load shed subroutine is illustrated. The load shed subroutine is begun at step 80. The load shed subroutine may be entered in a variety of ways. The routine may be entered as a result of a received command or it may be called up as a subroutine within another routine. The latter case is illustrated by block 64 of the initialization routine shown in FIG. 4.

The first step in the load shed routine is a decision step 82 wherein the logic control circuit 31 determines if latch loads are present. Latch loads are those loads which are not to be shed. Accordingly, if latch loads are present the control logic circuit 31, at step 84, takes appropriate action to assure that the latched loads will not be shed. From step 84, or from decision step 82 if there are no latched loads, the control logic circuit 31 operates on each load beginning with the last load as shown by block 86.

Decision step 88 determines if the last load is to be shed. If the load is to be shed a random number is calculated and added to a predetermined shed time as shown by block 90. The addition of the random number is necessary to assure that all of the loads are not reconnected simultaneously thereby causing a step increase in demand. The combination of the shed time and the random number are loaded into a load control timer for the load that was shed as shown by block 92. After loading the load control timer at step 92, or if a determination is made at decision step 88 not to shed the load, the index is decremented at step 94 so that the control logic circuit 31 will operate on the next to the last load. The decision step 96 allows the steps 88, 90, 92 and 94 to be repeated until the control logic circuit 31 has operated on all of the loads. Once the control logic circuit 31 has finished operating on the first load, it returns to the routine which it interrupted to perform the load shed subroutine as shown by balloon 97.

The discussion of the software flow charts illustrated in FIGS. 4, 5 and 6 are intended for purposes of illustration and not limitation. It is anticipated that alternative embodiments of the present invention may be conceived wherein the location of the instructions for performing the cold load subroutine is different from that shown in the discussed flow charts. These alternative embodiments are believed to fall within the spirit and scope of the present invention as claimed hereinafter.

What we claim is:

1. A microprocessor based load management terminal, said load management terminal being a component in a power distribution system for delivering electrical power and carrying information, said load management terminal comprising:
   a power line coupling unit connecting said load management terminal to the power distribution system;
   a signal receiver and conditioning unit producing a command signal in response to said power line coupling unit;
   control logic means performing load management functions in response to said command signal;
   a power supply producing supply voltages for said load management terminal;
   a plurality of load control switches each selectably connecting a load to said power distribution system in response to said control logic means; and
   a cold load pick-up monitoring one of said supply voltages, said cold load pick-up producing an output signal responsive to power outages, said output signal input to said control logic means such that said load is disconnected in response to said cold load pick-up;
   said loads being disconnected by said control logic means in response to a said cold load pick-up output signal for a predetermined shed time plus a randomly generated shed time such that said loads are reconnected to the power distribution system at different times.

2. The load management terminal of claim 1 wherein the load is disconnected by said control logic means in response to a said cold load pick-up output signal for a predetermined time in response to a power-outage of at least seventy-five seconds.

3. The load management terminal of claim 1 wherein the cold load pick-up includes a capacitor being charged to a predetermined voltage level in response to one of the supply voltages, a field-effect transistor connected across another of said supply voltages, said transistor being conductive in response to said voltage level of said capacitor, and a Schmitt trigger producing the output signal for disconnecting the load in response to the voltage across said transistor.

4. The load management terminal of claim 1 including means producing a clock signal, and wherein said cold load pick-up comprises a gate and means for producing said output signal, said clock signal producing means and said output signal producing means both being connected to an input of said gate, said gate selectively transmitting said clock signal to said control logic means in the absence of said output signal and transmitting said output signal to said control logic means when said output signal is present at said gate input.

5. The load management terminal of claim 1 including a time of day metering circuit calculating electric energy consumption for a plurality of predetermined rates including a base rate, said time of day metering circuit having an input connected to said cold load pick-up, and wherein said metering circuit calculates electric energy consumption for said base rate upon the receipt of said output signal by said control logic means.

* * * * *